(12) United States Patent
Hockanson et al.

(10) Patent No.: US 6,944,025 B2
(45) Date of Patent: Sep. 13, 2005

(54) EMI SHIELDING APPARATUS

(75) Inventors: David M. Hockanson, Boulder Creek, CA (US); Ron Zhang, Sunnyvale, CA (US); George Zacharisen, Santa Clara, CA (US); Deviprasad Malladi, Fremont, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 56 days.

(21) Appl. No.: 10/644,941

(22) Filed: Aug. 19, 2003

(65) Prior Publication Data

US 2004/0037042 A1 Feb. 26, 2004

Related U.S. Application Data

(60) Provisional application No. 60/405,038, filed on Aug. 20, 2002.

(51) Int. Cl.$^7$ ................................................. H05K 7/20
(52) U.S. Cl. ..................... 361/719; 361/704; 361/818; 174/16.3; 257/706; 257/713
(58) Field of Search ........................... 361/704, 709, 361/719, 818; 257/706, 713, 717–719, 722; 174/16.1, 16.3; 165/80.3, 185, 104.33

(56) References Cited

U.S. PATENT DOCUMENTS

| | | | |
|---|---|---|---|
| 5,357,404 A | * 10/1994 | Bright et al. | 361/818 |
| 5,371,404 A | * 12/1994 | Juskey et al. | 257/659 |
| 5,524,908 A | 6/1996 | Reis | |
| 5,566,052 A | 10/1996 | Hughes | |
| 5,748,455 A | 5/1998 | Phillips et al. | |
| 5,825,634 A | 10/1998 | Moorehead, Jr. | |
| 5,866,943 A | * 2/1999 | Mertol | 257/712 |
| 5,880,524 A | * 3/1999 | Xie | 257/704 |
| 5,932,925 A | * 8/1999 | McIntyre | 257/719 |
| 6,084,178 A | * 7/2000 | Cromwell | 174/35 R |
| 6,088,231 A | 7/2000 | Fajardo | |
| 6,137,051 A | 10/2000 | Bundza | |

(Continued)

OTHER PUBLICATIONS

"Identifying an EMI Source and Coupling Path in a Computer System with Sub–Module Testing"; Radu, et al. Electromagnetic Compatibility Laboratory, Department of Electrical Engineering, University of Missouri–Rolla, Rolla, MO & Electromagnetic Compatibility Group, Sun Microsystems, Mountain View, CA; p. 165–170; Jun. 1997.

"Radio Frequency Interference Seal"; IBM Technical Disclosure Bulletin, vol. 33, No. 5, IBM Corp., Armonk NY, Oct. 1990.

"Mechanical Enabling Efforts"; Intel Developer Forum, Sep. 2000.

"Intel Pentium 4 Processor in the 423–pin package EMI Guideline"; Oct. 2000.

*Primary Examiner*—Boris Chervinsky
(74) *Attorney, Agent, or Firm*—Meyertons Hood Kivlin Kowert & Goetzel, P.C.; B. Noël Kivlin

(57) ABSTRACT

An electromagnetic shielding structure is provided for a microprocessor or other electronic device that emits electromagnetic radiation. The structure includes a heat sink with an integrally formed depending skirt, and a conductive, compressible polymer is applied to a bottom surface of the skirt. The bottom surface mounts against a socket carried on a circuit board and is electrically coupled to a ground plane of the circuit board. The socket substantially surrounds the microprocessor in at least two dimensions (e.g. length and width). A shielding structure is formed at least partly by the heat sink, the socket and the ground plane.

17 Claims, 3 Drawing Sheets

U.S. PATENT DOCUMENTS

| | | | |
|---|---|---|---|
| 6,140,577 A | 10/2000 | Rapaich et al. | |
| 6,198,630 B1 * | 3/2001 | Cromwell | 361/704 |
| 6,219,239 B1 | 4/2001 | Mellberg et al. | |
| 6,239,359 B1 | 5/2001 | Lilienthal, II et al. | |
| 6,252,313 B1 | 6/2001 | Zhang et al. | |
| 6,259,609 B1 | 7/2001 | Kurz | |
| 6,269,863 B1 | 8/2001 | Wyler | |
| 6,278,617 B1 | 8/2001 | Yang et al. | |
| 6,288,330 B1 | 9/2001 | Chen | |
| 6,324,074 B1 | 11/2001 | Lunden | |
| 6,362,477 B1 | 3/2002 | Sowerby et al. | |
| 6,362,977 B1 | 3/2002 | Tucker et al. | |
| 6,400,577 B1 * | 6/2002 | Goodwin et al. | 361/816 |
| 6,444,900 B1 | 9/2002 | Casey | |
| 6,452,113 B2 | 9/2002 | Dibene, II et al. | |
| 6,515,861 B1 * | 2/2003 | Andric et al. | 361/709 |
| 6,524,120 B2 | 2/2003 | Zhao | |
| 6,573,590 B1 | 6/2003 | Radu et al. | |
| 6,577,504 B1 * | 6/2003 | Lofland et al. | 361/709 |
| 6,606,246 B2 * | 8/2003 | Wells | 361/719 |
| 6,654,256 B2 | 11/2003 | Gough | |
| 6,683,796 B2 | 1/2004 | Radu et al. | |
| 6,775,140 B2 | 8/2004 | Shim et al. | |
| 6,819,553 B2 | 11/2004 | Willis et al. | |
| 6,819,572 B2 | 11/2004 | Schaffer | |

* cited by examiner

EMI SHIELDING APPARATUS

This application claims the benefit of Provisional Application No. 60/405,038, filed Aug. 20, 2002.

BACKGROUND OF THE INVENTION

The present invention relates to a system configured to reduce electromagnetic interference (EMI) from electronic systems, in particular microprocessor-based systems using heat sinks.

As microprocessors and other electronic components are driven at ever faster frequencies, electromagnetic emissions are becoming more challenging to reduce or eliminate, especially for higher-powered components. At the same time, legal regulations surrounding EMI emissions are becoming more stringent, so the greater technical challenge is compounded by a greater regulatory challenge.

In principle, it is possible to build a Faraday cage around an electronic component to prevent the radiative emissions from reaching the local environment. However, in practice, an ideal Faraday cage is not generally achieved, due to the generally rectangular shapes of electronic components, the perforation of the shielding by connections and other devices, and other practical requirements.

In addition, it has been found that electromagnetic emissions may couple the heat sink associated with a component such as a microprocessor, such that the heat sink itself acts to radiate electromagnetic energy, via the host system, to the environment.

An apparatus is therefore needed that reduces electromagnetic emissions below a desired level, similar in function to an ideal Faraday cage but accommodating the requirements of commercial electronics, in particular microprocessor-based systems.

SUMMARY OF THE INVENTION

An apparatus configured to provide electromagnetic shielding for a microprocessor or other electronic device includes a heat sink with an integrally formed depending skirt to which a conductive polymer gasket is applied. The microprocessor is mounted in a socket which is mounted on and electrically (i.e. conductively) coupled to a circuit board. The socket is stitched through blind vias to a ground plane (or other reference voltage plane) in the circuit board.

The heat sink, gasket, socket and ground plane are configured to form an electromagnetic cage around the processor, with the precise configuration depending upon the electromagnetic frequencies, power dissipation and field structures that are expected to be generated.

The heat sink may be formed of anodized aluminum, in which case a region of the skirt adjacent the gasket is maintained clear of anodization, oxidation or other insulating layers, to ensure good electrical coupling to the socket. In an alternative embodiment, the heat sink may be mounted directly to the circuit board, i.e. without an intervening socket, in which case a conductive trace is provided on the circuit board, configured to couple the heat sink to the ground plane.

DETAILED DESCRIPTION OF THE INVENTION

Figure 1:
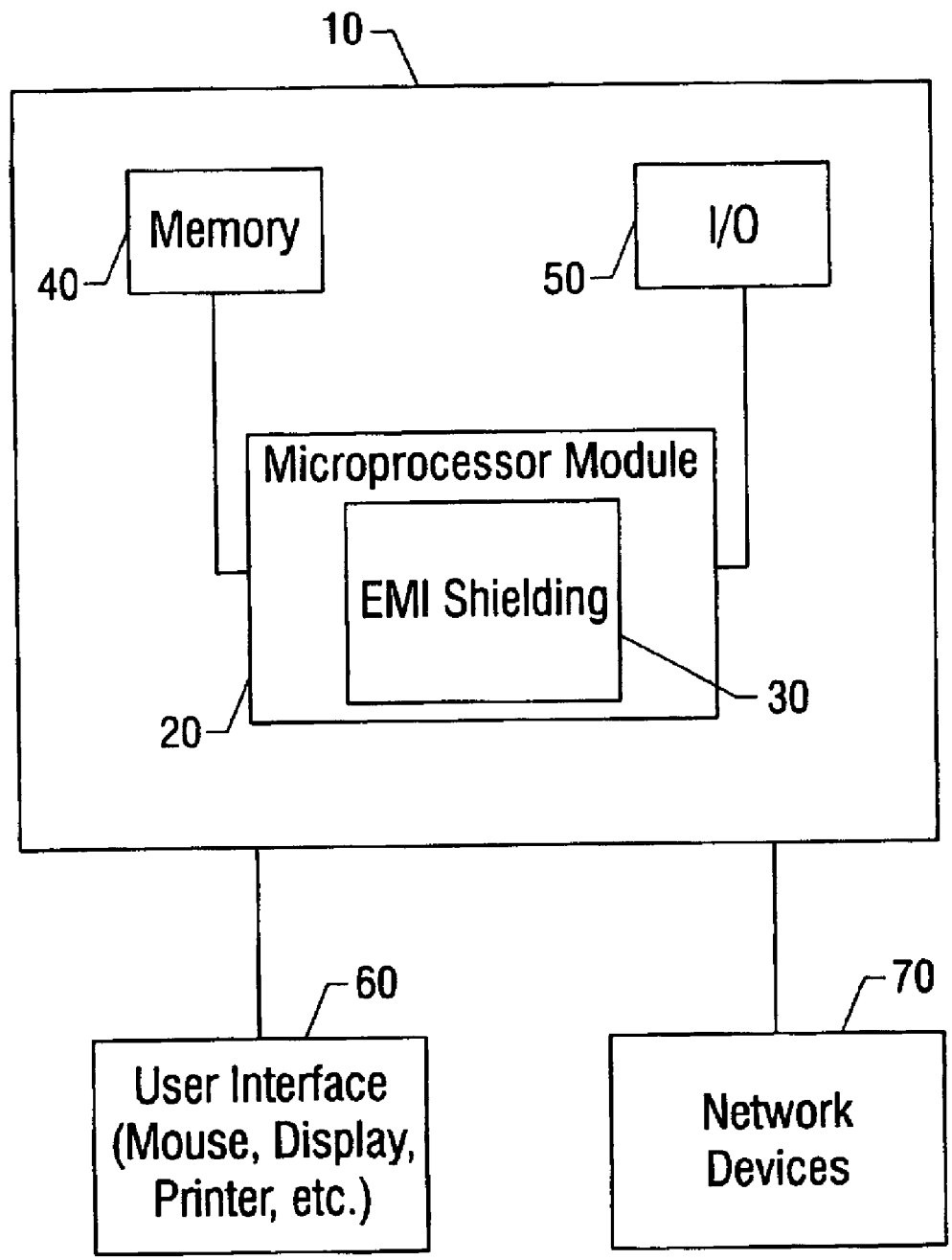
FIG. 1 is a diagram of a processor-based system incorporating an embodiment of the present invention.

A processor-based system 10 implementing an embodiment of the invention is shown in the block diagram of FIG. 1. The system 10 includes a microprocessor module 20 with accompanying EMI shielding 30. The module 20 includes at least one microprocessor operating in a conventional fashion and communicating with memory 40 and I/O (input-output) circuitry and/or logic 50. The I/O circuitry may include network circuitry and connections.

A user interface 60 coupled to the system 10 includes a mouse, display, printer, track ball, and/or other devices allowing a user to interact with the system 10. Network devices 70 and/or other conventional devices may likewise be in communication with the system 10.

Figure 2:
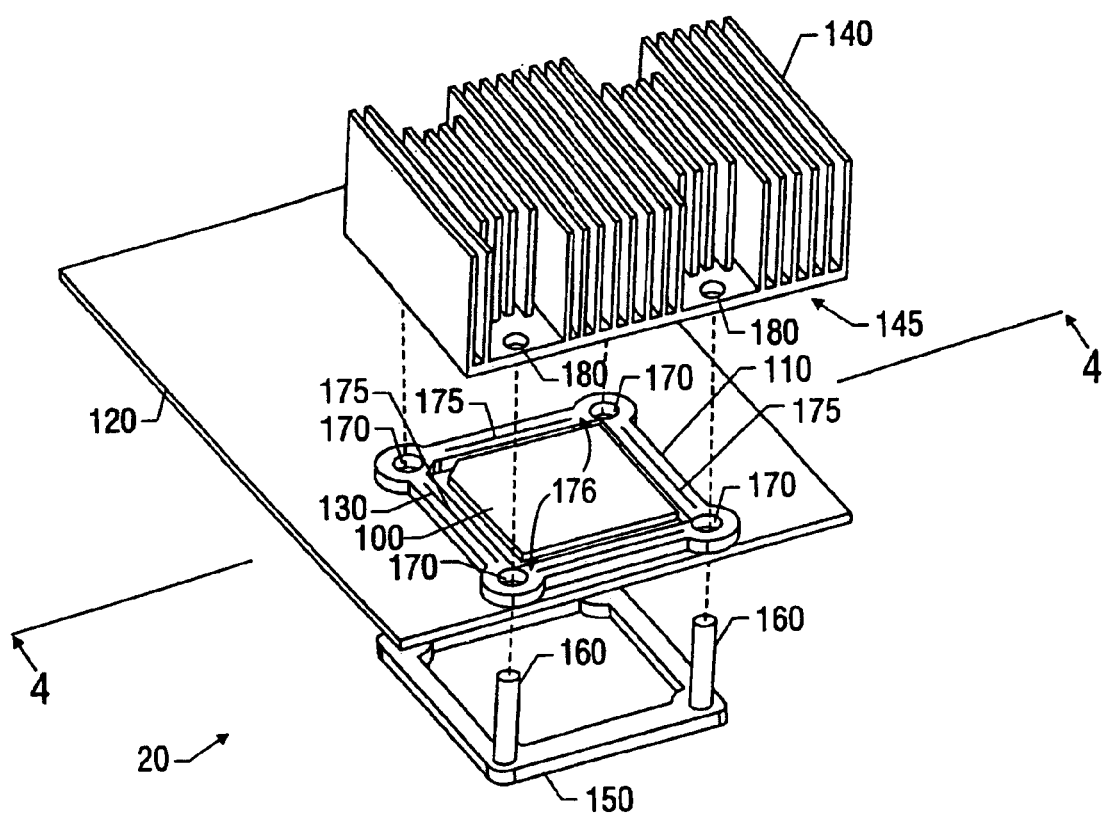
FIG. 2 is an exploded perspective view of a heat sink according to the invention in conjunction with a socket according to the invention.

The perspective view of FIG. 2 shows the microprocessor module 20 in greater detail. The microprocessor 100 is mounted on a socket 110, which in turn is mounted on a circuit board 120, which in a conventional manner may be a centerplane, motherboard, daughter board, or other unit that carries circuit elements and electronic components as needed for the system 10. The socket 110 includes a perimeter 130 which has a shape generally similar to an outside shape of the processor 100, or if not similar in shape at least configured so as to substantially surround the perimeter of the processor. The socket is formed at least partially from an electrically conductive material, which may be metal, conductive plastic, or other suitable at least semi-rigid material.

A heat sink 140 is mounted adjacent the processor 100 and couples to a bolster plate 150. The heat sink 140 has a surface 145 that is positioned towards the processor 100 and socket 110, and is in thermal contact with the processor to draw heat from it for dissipation.

The bolster plate 150 has legs 160 that extent through holes 170 in the socket 110 and holes 180 in the heat sink 140. The module 20 is assembled by attaching bolts, nuts or other conventional attachment devices (not separately shown) to the legs 160, thereby drawing the module components into electrical contact with one another.

The socket 110 in one embodiment of the invention is specially adapted to inhibit the radiation of electromagnetic emmissions from the processor 120 to the environment. In typical applications, the heat sink 140 is formed of a heat-conductive substance, which in conventional systems is often anodized aluminum or some other metal. In the present invention, the socket perimeter 130 is configured to form an electrically conductive path to the heat sink 140. One manner of doing this is to remove any insulation material (such as oxidation or anodization) from both the heat sink 140 and the socket perimeter 130, and in addition (or instead) material may be added to either or both of the heat sink and the socket to assist electrical coupling. In some embodiments, an electrically conductive gasket 175 may be positioned on socket 110 and extending along at least a portion of socket perimeter 130. The gasket 175 as shown in FIG. 2 is formed in four separate segments, which in this case are positioned and sized with gaps 176 between them.

Figure 3:
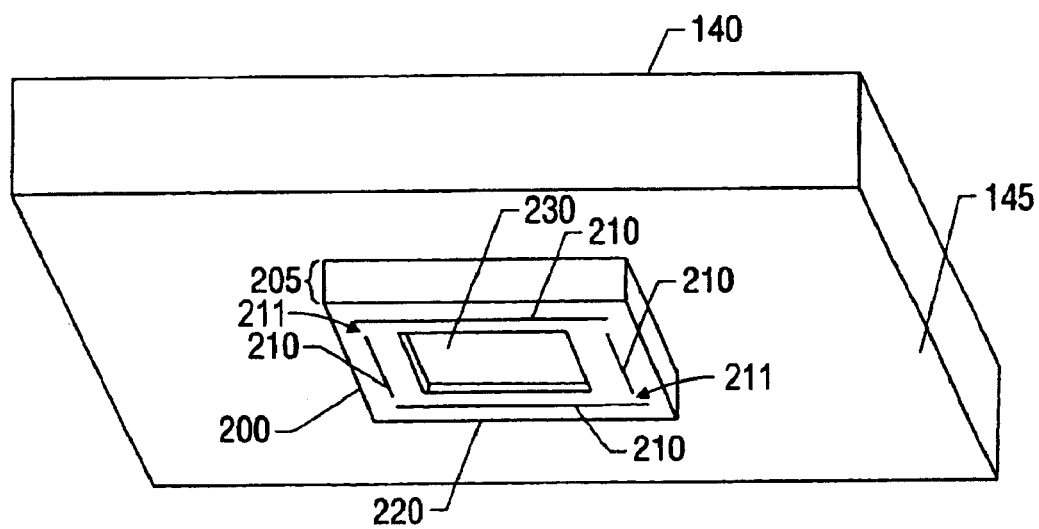
FIG. 3 is a perspective view of an underside of a heat sink according to the invention.

FIG. 3 shows the heat sink 140 from the underside in perspective view. Details of the heat sink 140, such as radiative fins and mounting holes, are not shown in FIG. 3 for the sake of simplicity. The heat sink 140 includes an electrically conducting "skirt" 200, which is preferably formed as an integral part of the heat sink 140, such as by milling or by casting. Alternatively, the skirt may be formed separately and coupled to the heat sink in such a way as to maintain a strong electrical coupling between the two. The skirt is formed at least partially from an electrically conductive material, which may be metal, conductive plastic, or other suitable at least semi-rigid material. The coupling may be accomplished by bonding, welding, cementing or other manners of connecting the heat sink and the skirt. In general, forming the heat sink and skirt in a unitary fashion will both increase physical integrity and provide better electrical coupling and shielding.

In general, the heat sink may include other configurations of coupling structures (e.g. a ridge, a ring, multiple ridges, etc.) that may serve as the skirt 200, where the coupling structure is electrically coupled to the heat sink and to a receiving structure (such as a socket or circuit board) in such a manner that the processor or other electronic device is shielded so as to reduce emissions.

The skirt 200 may form a gap 230 as shown in FIG. 3, or in other embodiments the surface 220 may be formed such that it is substantially flat. The selected configuration is guided by the application desired, and in particular by the physical shape of the device for which the heat sink is intended to dissipate heat.

A gasket 210 is applied to a surface 220 (which in this configuration is a bottom surface) of the skirt 200, the surface 220 being positioned towards the processor 100, which when the heat sink 140 is mounted may extend at least partly into the gap 230, if a gap is used. For greater heat dissipation of the processor 100, a greater amount of physical, thermal contact between the processor and the heat sink is helpful.

The gaskets 210 in one embodiment is formed of a conductive polymer, which bonds to both the skirt 200 and the socket perimeter 130. Other conductive bonding materials may be used. The gasket as shown FIG. 3 is formed in four separate segments, which in this case are positioned and sized with gaps 211 betweem them. The sizes of the allowable intervening gaps will depend upon the frequency and power of the shielded device or devices, the expected field shape or structure, and the amount of desired attenuation of the electromagnetic radiation. Alternatively, a continuous or substantially continuous gasket may be used, or different numbers of segments may be formed.

Figure 4:
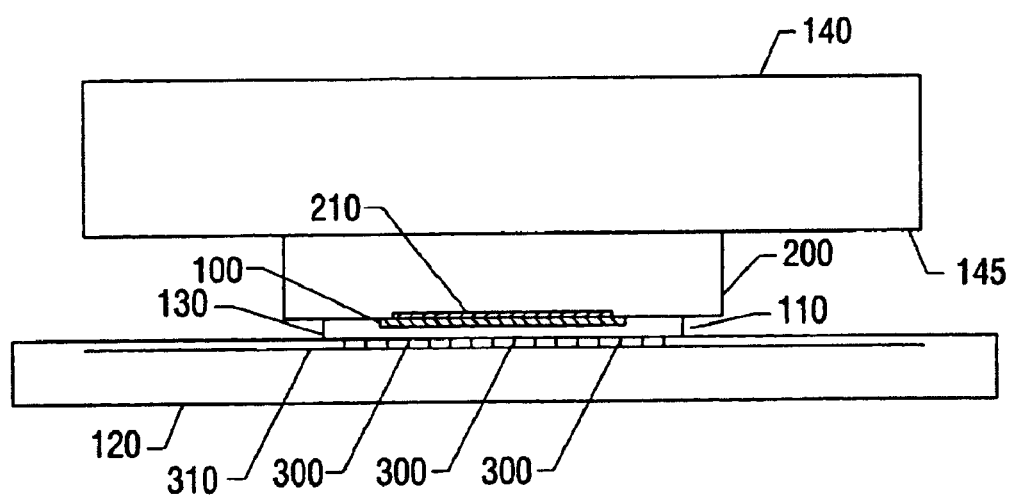
FIG. 4 is a (nonexploded) sectional view taken along line 4—4 of FIG. 2.

As shown in FIG. 4, the socket 110 is electrically coupled to the circuit board 120 by "stitching" the socket to vias (or other electrical paths) 300, spaced as close as desired to minimize electromagnetic emissions. Due to manufacturing limitations of some current methods, the closest spacing may be on the order of 50 mils (about 1.3 millimeters). However, the spacing may be less than this with appropriate methods, and in general should be made as close as necessary to attenuate electromagnetic radiation through the region of the vias to a desired degree, and far enough apart to avoid manufacturing difficulties and expense to the extent possible, given emission constraints.

These vias are metallic holes into the circuit board, and may be blind vias, i.e. extend only partway through the circuit board. In one embodiment, the blind vias 300 are conductively coupled to a reference or ground plane 310, which is electrically tied to a ground or reference voltage relative to the system 10.

With this arrangement, it can be seen in FIG. 4 that a substantially continuous electromagnetic shielding structure is formed by the heat sink 140, skirt 200, gasket 210, socket 110, vias 300 and ground plane 310, which substantially surrounds the processor 100. The shielding is substantially continuous in the sense that, though there may be gaps in the effective enclosure formed by the electromagnetically shielding elements, there is a sufficient enclosure to attenuate electromagnetic signals at the relevant frequencies.

These frequencies will depend on the specific application—for current microprocessors, they can exceed 1 GHz, and may be much less or greater, depending upon the components being shielded. The allowable spacing and positioning of any gaps in the electromagnetic enclosure will depend in part upon frequency and power dissipation of the shielded device, as well as the resulting magnetic field structure, with higher frequencies generally requiring smaller gaps to ensure high attenuation.

The skirt 200 has a height or thickness 205 (see FIG. 3), which, combined with a thickness of the gasket 210, may be slightly greater than a desired, predetermined distance between surface 145 of the heat sink 140 and the surface of the socket perimeter 130, so that when the heat sink is mounted on the socket, the gasket 210 is slightly compressed, forming a tight seal, which is more likely to maintain good electrical coupling.

In an alternative embodiment, the heat sink may be mounted so as to contact the circuit board 120 directly, i.e. without the use of the intervening socket 110. In this case, an electrical coupling (e.g. conductive contact) may be formed between the gasket 210 and the circuit board 120, for which purpose conductive traces may be formed on a surface of the circuit board 120, configured to contact the gasket 210.

The heat sink 140 according the present invention thus provides electromagnetic shielding for a processor or other device in an easily manufactured and easily assembled configuration. Forming the skirt 200 in a unitary fashion with the heat sink, and applying the polymer gasket as part of the heat sink manufacturing process, results in a heat sink that is more easily assembled with the processor module than if separate shielding components are used.

Use of the socket 110 further facilitates the construction of a processor module that is well shielded and yet easy to assemble. These two components—the socket and the heat sink as described—cooperate to attenuate electromagnetic emissions to the extent desired, with variable configurations depending upon the application and emissions requirements.

What is claimed is:

1. An apparatus configured as an electromagnetic shield for an electronic device, including:
   a heat sink having a coupling structure;
   a receiving structure configured to electrically couple to the coupling structure; and
   a coupling material disposed between the heat sink and the receiving structure, configured to maintain the electrical coupling,
   the receiving structure including a circuit board and a socket on the circuit board, the socket being configured to receive the electronic device, and wherein the electromagnetic shield includes at least portions of each of the heat sink, the socket, and the circuit board, wherein the electromagnetic shield includes gaps near the electronic device, the gaps being devoid of conductive material, and wherein the gaps are positioned and sized such that the electromagnetic shield provides a sufficient amount of attenuation of electromagnetic emmissions from the electronic device.

2. The apparatus of claim 1, wherein the coupling structure comprises a skirt integrally formed as a part of the heat sink.

3. The apparatus of claim 2, wherein the coupling material comprises a conductive substance disposed on a surface of the skirt.

4. The apparatus of claim 3, wherein the conductive substance is compressible.

5. The apparatus of claim 3, wherein the conductive substance comprises a conductive polymer.

6. The apparatus of claim 1, wherein the socket includes a surface configured to electrically couple to the coupling structure.

7. The apparatus of claim 6, wherein the socket includes a perimeter configured to substantially surround the electronic device.

8. The apparatus of claim 1, wherein the electromagnetic shielding is configured to attenuate electromagnetic emissions from the electronic device to a local environment to a predetermined degree.

9. A circuit board assembly adapted for use in a processor-based system, including:
   a circuit board including a reference voltage plane;
   a socket mounted on a surface of the circuit board, the socket being formed at least in part from an electrically conductive material and including a cavity configured to receive a processor;
   a heat sink including an electrically conductive skirt on a surface of the heat sink, the skirt configured to electrically couple to the socket and thereby to form an electromagnetic shield around a processor positioned within the cavity, the electromagnetic shield including at least portions of the heat sink, the conductive skirt, the socket, and the reference voltage plane; and an electrically conductive gasket positioned on the socket and extending at least partly around a circumference of the socket, wherein the electrically conductive gasket is configured to couple electrically between the skirt and the socket and to form a portion of the electromagnetic shield.

10. The circuit board of claim 9, wherein the electrically conductive gasket is formed from a compressible conductive polymer.

11. The circuit board claim 9, wherein the electrically conductive skirt and the heat sink are formed as an integral unit.

12. The circuit board of claim 10, wherein the electrically conductive skirt and the heat sink are formed from a substantially continuous piece of aluminum.

13. The circuit board of claim 9, further including a plurality of vias electrically coupling the socket to the reference voltage plane.

14. A processor-based system, including:
   a circuit board carrying a processor and including a reference voltage plane;
   a socket mounted on a surface of the circuit board, the socket being formed at least in part from an electrically conductive material and including a cavity configured to receive the processor;
   a compressible, electrically conductive gasket positioned on the socket and extending at least partly around a circumference of the socket;
   at least one electrical path configured to electrically couple the reference voltage plane with the socket;
   a heat sink including an electrically conductive skirt configured to contact the gasket and electrically couple therethrough to the socket, to form an electromagnetic shield around the processor, the electromagnetic shield including at least portions of the heat sink, the conductive skirt, the socket, and the ground plane.

15. The circuit board of claim 14, wherein the electrically conductive skirt and the heat skirt are formed from a substantially continuous piece of aluminum.

16. A method of forming an electromagnetic shield for a processor, including the steps of:
   forming a heat sink with a conductive skirt, the heat sink and conductive skirt being formed from at least one electrically conductive material;
   forming a socket from at least another electrically conductive material, the socket including a cavity configured to receive a processor;
   forming a gasket from a compressive, conductive material on a surface of the socket;
   electrically coupling the socket to a ground plane of a circuit board configured to receive the processor, and
   positioning the heat sink, the socket with the gasket, and the circuit board such that when the processor is positioned within the cavity it is substantially shielded against emission of electromagnetic radiation, wherein the electromagnetic shield includes at least portions of the heat sink, the conductive skirt, the socket, and the ground plane; and providing gaps in the electromagnetic shield, wherein the gaps are positioned and sized such that the electromagnetic shield provides a sufficient amount of attenuation of electromagnetic emissions from the electronic device, wherein the gaps are devoid of conductive material and located near the electronic device.

17. The method of claim 16, wherein the step of forming the heat sink includes forming the heat sink and conductive skirt from a single piece of aluminum.

* * * * *